United States Patent [19]

Coppens et al.

[11] Patent Number: 5,436,110
[45] Date of Patent: Jul. 25, 1995

[54] IMAGING ELEMENT AND METHOD FOR MAKING ALUMINUM LITHOGRAPHIC PRINTING PLATES ACCORDING TO THE SILVER SALT DIFFUSION TRANSFER PROCESS

[75] Inventors: Paul Coppens, Turnhout; Guido Hauquier, Nijlen; Marcus Jonckheere, Oostkamp; Willem Cortens, Booischot; Augustin Meisters, Gentbrugge, all of Belgium

[73] Assignee: AGFA-Gevaert, N.V., Mortsel, Belgium

[21] Appl. No.: 266,890

[22] Filed: Jul. 5, 1994

[30] Foreign Application Priority Data

Aug. 5, 1993 [EP] European Pat. Off. ............ 93202312

[51] Int. Cl.⁶ .......................... G03C 8/28; G03F 7/07
[52] U.S. Cl. .................................. 430/204; 430/231; 430/278; 101/459
[58] Field of Search ................ 430/204, 231, 278; 101/459

[56] References Cited

U.S. PATENT DOCUMENTS

| | | | |
|---|---|---|---|
| 3,161,508 | 12/1964 | Hephet et al. | 430/204 |
| 3,424,580 | 1/1969 | Wainer | 430/231 |
| 4,425,420 | 1/1984 | De Jaeger et al. | 430/231 |
| 5,068,165 | 11/1991 | Coppens et al. | 430/231 |
| 5,273,858 | 12/1993 | Coppens et al. | 430/204 |

FOREIGN PATENT DOCUMENTS 0546598  6/1993  European Pat. Off. ............ 430/231

*Primary Examiner*—Richard L. Schilling
*Attorney, Agent, or Firm*—Breiner & Breiner

[57] ABSTRACT

The present invention provides an imaging element comprising in the order given (i) a hydrophilic grained and anodized aluminum support with an aluminum oxide barrier layer of at least 10 nm thickness, (ii) an image receiving layer containing physical development nuclei in an amount of at least 0.7 mg/m² and (iii) a photosensitive layer containing a silver halide emulsion being in water permeable relationship with said image receiving layer. The invention also relates to a method for making lithographic plates with said imaging element.

10 Claims, No Drawings

IMAGING ELEMENT AND METHOD FOR MAKING ALUMINUM LITHOGRAPHIC PRINTING PLATES ACCORDING TO THE SILVER SALT DIFFUSION TRANSFER PROCESS

DESCRIPTION

1. Field of the invention

The present invention relates to an imaging element for making improved aluminum offset printing plates according to the silver salt diffusion transfer process. Furthermore the present invention relates to a method for making improved aluminum offset printing plates with said imaging element.

2. Background of the invention

The principles of the silver complex diffusion transfer reversal process, hereinafter called DTR-process, have been described e.g. in US-P-2,352,014 and in the book "Photographic Silver Halide Diffusion Processes" by André Rott and Edith Weyde—The Focal Press—London and New York, (1972).

In the DTR-process non-developed silver halide of an information-wise exposed photographic silver halide emulsion layer material is transformed with a so-called silver halide solvent into soluble silver complex compounds which are allowed to diffuse into an image-receiving element and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellant ink-receptive areas on a water-receptive ink-repellant background.

The DTR-image can be formed in the image-receiving layer of a sheet or web material which is a separate element with respect to the photographic silver halide emulsion material (a so,called two-sheet DTR element) or in the image-receiving layer of a so-called single-support-element, also called mono-sheet element, which contains at least one photographic silver halide emulsion layer integral with an image-receiving layer in waterpermeable relationship therewith. It is the latter mono-sheet version which is preferred for the preparation of offset printing plates by the DTR method.

Two types of the mono-sheet DTR offset printing plate exist. According to a first type disclosed in e.g. U.S. Pat. No. 4,722,535 and GB1,241,661 a support is provided in the order given with a silver halide emulsion layer and a layer containing physical development nuclei serving as the image-receiving layer. After information-wise exposure and development the imaged element is used as a printing plate without the removal of the emulsion layer.

According to a second type of mono-sheet DTR offset printing plate a hydrophilic base, commonly anodized aluminum, is provided in the order given with a layer of physical development nuclei and a silver halide emulsion layer. After information-wise exposure and development the imaged element is treated to remove the emulsion layer so that a hydrophilic base carrying a silver image is left wich is used as a printing plate. Such type of lithographic printing plate is disclosed e.g. in U.S. Pat. No. 3,511,656.

As for other printing plates it is required that the printing plates obtained according to the above described DTR-process have a high printing endurance, good ink acceptance in the printing areas and no ink acceptance in the non-printing areas (no staining). With respect to these requirements it is teached that the graining and anodizing of the aluminum plate play a very important role e.g. in U.S. Pat. No. 5,213,943; 5,273,858 and EP-A-567,178. In EP-A-048,721 an aluminum offset printing plate of high quality and relatively long service life made according to the DTR-process is described using an aluminum support with a CLA value between 0.05 and 1 $\mu$m and an aluminum oxide layer which has a superficial weight between 0.2 and 2 $g/m^2$. In U.S. Pat. No. 4,859,290 an aluminum offset printing plate less prone to corrosion and having improved printing life made according to the DTR-process is described using an aluminum support with an anodic weight ($g/m^2$) to surface roughness CLA ($\mu$m) ratio greater than or equal to 6.

However there is still a need for aluminum offset printing plates made according to the DTR-process with better printing properties such as less staining and higher printing endurance, especially in exhausted chemistry.

3. SUMMARY OF THE INVENTION

It is an object of the present invention to provide an imaging element for making aluminum offset printing plates according to the silver salt diffusion transfer process with improved printing properties.

It is another object of the present invention to provide a method for making aluminum offset printing plates with said imaging element having improved printing properties.

Further objects of the present invention will become clear from the description hereinafter.

According to the present invention there is provided an imaging element comprising in the order given (i) a hydrophilic grained and anodized aluminum support, (ii) an image receiving layer containing physical development nuclei and (iii) a photosensitive layer containing a silver halide emulsion being in water permeable relationship with said image receiving layer, characterized in that said aluminum support comprises an aluminum oxide barrier layer of at least 10 nm thickness and said physical development nuclei are contained in an amount of at least 0.4 $mg/m^2$.

According to the present invention there is also provided a method for making an offset printing plate according to the silver salt diffusion transfer process having improved printing properties comprising the steps of:

(a) image-wise exposing an imaging element as described above, (b) applying an aqueous alkaline solution to the imaging element in the presence of (a) developing agent(s) and (a) silver halide solvent(s) to form a silver image in said photosensitive layer and to allow unreduced silver halide or complexes formed thereof to diffuse image-wise from the photosensitive layer to said image receiving layer to produce therein a silver image, (c) treating the imaging element to remove the layer(s) on top of said image receiving layer, thereby uncovering said silver image formed in said image receiving layer.

DETAILED DESCRIPTION OF THE INVENTION

According to the present invention it has been found that an aluminum lithographic printing plate prepared according to the DTR-process by exposing an imaging element comprising on a hydrophilic grained and anodized aluminum support with an aluminum oxide barrier layer of at least 10 nm thickness a image receiving layer containing physical development nuclei in an amount of at least 0.4 mg/m$^2$ and a photosensitive layer containing a silver halide emulsion, processing said imaging element and removing the photosensitive layer, thereby uncovering the silver image formed in said image receiving layer has good printing properties i.e. good ink acceptance in the printing areas, no ink acceptance in the non-printing areas and a high printing endurance even in exhausted chemistry.

An anodic oxide film consists of two layers, the porous thick outer layer growing on an inner layer which is thin, dense and dielectrically compact and preferably called the barrier layer, also called the active or dielectric layer. This layer is very thin, i.e. usually between 0.1 and 5.0% of the total film thickness, and its thickness depends on the composition of the electrolyte and the operating conditions, especially the voltage.

According to the invention the anodization of the grained aluminum support is performed in such a way that an aluminum oxide barrier layer of at least 10 nm thickness is obtained. The upper limit is not very important but should preferably be less than 100 nm. More preferably the thickness of the barrier layer should be between 15 and 50 nm.

The thickness of the barrier layer is measured on an image of a cross-section of the grained and anodized aluminum foil made by SEM (scanning electron microscopy).

A grained and anodized aluminum support with an aluminum oxide barrier layer of at least 10 nm thickness may be obtained by anodizing a roughened and optional chemical etched aluminum foil as follows.

An alternating or direct electric current, preferably a direct electric current is passed through the grained aluminum foil immersed as an electrode in a solution containing sulfuric acid, phosphoric acid, oxalic acid, chromic acid or organic acids such as sulfamic, benzosulfonic acid, etc. or mixtures thereof. Preferably the electrolyte is a sulfuric acid solution in a concentration from 5 to 50% by weight, more preferably in a concentration from 15 to. 25% by weight that can be used within a temperature range from 0°-60° C., preferably within a temperature range from 30°-50° C.

The counter electrode consist essentially of a relatively inert material e.g. lead, stainless steel, graphite, aluminum, etc. The voltage is at least 10 V, preferably lies within the range 15–100 V and is applied for at least 2 s.

The anodization of the aluminum is performed until the desired thickness of the anodization layer is reached. The aluminum foil may be anodized on both sides. The thickness of the anodization layer is most accurately measured by making a micrographic cut but can be determined likewise by dissolving the anodized layer and weighing the plate before dissolution treatment and subsequent thereto or by still other appropriate methods including X-Ray Fluorescence. Preferably the anodization layer thickness is between 0.3 and 4.0 μm. More preferably the thickness lies between 0.5 and 3.0 μm. In order to obtain said thickness, the nett anodic charge density may vary from 50 to 2000 C/dm$^2$, preferably from 300 to 1000 C/dm$^2$.

The anodized aluminum foil may subsequently be rinsed with demineralised water within a temperature range of 10° –80° C.

More details on the anodization of aluminum are described by S. Wernick and R. Pinner in "The surface treatment and finishing of aluminum and its alloys", Robert Draper, Teddington (1972).

The image receiving layer contains physical development nuclei in an amount of at least 0.4 mg/m$^2$. The upper limit is not very important but should preferably be less than 25 mg/m$^2$. More preferably the amount is comprised between 1.1 mg/m$^2$ and 20 mg/m$^2$. The image receiving layer used in accordance with the present invention is preferably free of hydrophilic binder but may comprise small amounts up to 30% by weight of the total weight of said layer of a hydrophilic colloid e.g. polyvinyl alcohol to improve the hydrophilicity of the layer.

Preferred development nuclei for use in accordance with the present invention are sulphides of heavy metals e.g. sulphides of antimony, bismuth, cadmium, cobalt, lead, nickel, palladium, platinum, silver, and zinc. Other suitable development nuclei are salts such as e.g. selenides, polyselenides, polysulphides, mercaptans, and tin (II) halides. Heavy metals, preferably silver, gold, platinum, palladium, and mercury can be used in colloidal form. More preferred development nuclei for use in accordance with the present invention are nuclei, especially sulphides of heavy metals having an average diameter less than 6 nm and wherein the number of nuclei having a diameter larger than 4.5 nm is less than 15% of the total number of nuclei contained in said image receiving layer as disclosed in EP-A 546598. Especially preferred development nuclei used in connection with the present invention are palladium sulphide nuclei having an average diameter less than 6 nm and wherein the number of nuclei having a diameter larger than 4.5 nm is less than 15% of the total number of nuclei contained in said image receiving layer.

The aluminum support of the imaging element used according to the present invention can be made of pure aluminum or of an aluminum alloy, the aluminum content of which is at least 95%. A useful alloy is e.g. one comprising 99.55% by weight of Al, 0.29% of Fe, 0.10% of Si, 0.004% of Cu, 0.002% of Mn, 0.02% of Ti, and 0.03% of Zn. The thickness of the support usually ranges from about 0.13 to about 0.50 mm.

The preparation of aluminum or aluminum alloy foils for lithographic offset printing comprises the following steps: graining, anodizing, and optionally posttreating of the foil.

According to the present invention the surface of the aluminum substrate can be toughened either by mechanical, chemical or electrochemical graining or by a combination of these.

The electrochemical graining process is preferred because it can form a uniform surface roughness having a large average surface area with a very fine and even grain which is commonly desired when used for lithographic printing plates.

According to the present invention electrochemical graining can be conducted in a hydrochloric and/or nitric acid containing electrolyte solution using an alternating or direct current. Other aqueous solutions that can be used in the electrochemical graining are e.g.

acids like HCl, HNO$_3$, H$_2$SO$_2$, H$_3$PO$_4$, that if desired, contain additionally one or more corrosion inhibitors such as Al(NO$_3$)$_3$, AlCl$_3$, boric acid, chromic acid, acetic acid, sulfates, chlorides, nitrates, monoamines, diamines, aldehydes, phosphates, H$_2$O$_2$, etc.

Electrochemical graining in connection with the present invention can be performed using single-phase and three-phase alternating current. Alternating current waves can be a sine wave, a square wave, trapezoidal wave, etc. The anodic charge may be greater or lower than the cathodic charge. The voltage applied to the aluminum plate is about 1–100 V and preferably 10–35 V. A current density of 3–150 Amp/dm$^2$ is employed for 5–240 seconds. The temperature of the electrolytic graining solution may vary from 5°–50° C. Electrochemical graining is carried out preferably with an alternating current from 10 Hz to 300 Hz.

Mechanical and electrochemical methods may be combined as disclosed in U.S. Pat. No. 4,476,006 and 4,477,317.

The roughness produced by the graining is frequently measured as a centre line average (CLA) value which is an arithmetic mean roughness expressed in $\mu$m and preferably varies from about 0.2 to about 1.5 $\mu$m. More preferably the aluminum support in accordance with the present invention has a CLA value between 0.4 and 1.1 $\mu$m. The roughness is measured with a Taylor-Hobson Talysurf 10, equipped with a diamond needle with a diameter of 2.5 $\mu$m under a pressure of 1.0 mN over a cut-off length of 0.8 mm.

The roughening is preferably preceded by a degreasing treatment mainly for removing fetty substances from the surface of the aluminum foil. Therefore the aluminum foil may be subjected to a degreasing treatment with a surfactant and/or an aqueous alkaline solution. Degreasing can be performed by a 2-step treatment either treating the aluminum foil with an alkaline solution followed by a desmutting in an acidic solution or degreasing in an acidic solution followed by an alkaline desmutting.

Preferably roughening is followed by a chemical etching step using an aqueous solution containing an acid. Alternatively chemical etching may be carried out using an aqueous solution containing alkali. More details on the graining and etching of an aluminum foil suitable for use in the present invention are given in e.g. EP-A 567178, which therefor is incorporated herein by reference.

After the anodizing step the anodic surface may be posttreated such as sealing. Sealing of the pores of the aluminum oxide layer formed by anodization is a technique known to those skilled in the art of aluminum anodization. This technique has been described in e.g. the "Belgisch-Nederlands tijdschrift voor Oppervlaktetechnieken van materialen", 24ste jaargang/januari 1980, under the title "Sealing-kwaliteit en sealing-controle van geanodiseerd Aluminum". Different types of sealing of the porous anodized aluminum surface exist.

A preferred posttreatment is performed by treating a grained and anodized aluminum support with an aqueous solution containing a bicarbonate as disclosed in EP-A 567178, which therefor is incorporated herein by reference. Thanks to the posttreatment longer press runs can be made with the printing plate obtained. The porous aluminum oxide layer is soluble in aqueous alkaline solutions. At the moment the anodic layer is (locally) dissolved there is a visually observable evolution of hydrogen gas and the corrosion-potential of alumini- num (ca $-1.7$ V) is obtained. Preferably the resistance against corrosion by a freshly prepared aqueous 0.1M sodium hydroxide (less than 1 h old) solution at 22° C. of the grained and anodized side of the aluminum support according to the invention should be at least 30 seconds, more preferably at least 60 seconds. As a result the occurrence of fog in the non-printing areas of the printing plate is avoided substantially. The measurement is made by dipping said grained and anodized aluminum support, completely protected from contact with a solution by taping off or lacquering said plate except for 10 cm$^2$ of the grained and anodized surface area in 100 ml of said aqueous 0.1M sodium hydroxide solution at 22° C.

Preferably each of the above described steps is separated by a rinsing step to avoid contamination of the liquid used in a particular step with that of the preceding step.

Subsequent to the preparation of the aluminum foil as described above the aluminum foil may be immediately coated with a solution containing the physical development nuclei or may be coated with said solution at a later stage.

Said solution containing the physical development nuclei can be coated by different coating systems. Preferably a membrane coater is used. This system is especially suitable for the coating of binderfree aqueous layers on a hard, non-permeable underlayer. It is preferably used without any wetting agent what is advantageous for the stability of the physical development nuclei containing solution. The dry thickness of the coated layer is substantially controlled by the concentration of the physical development nuclei in the coating solution and the roughness of the grained and anodized aluminum support. For an aluminum support with a CLA value of $\sim 0.7$ $\mu$m an aqueous film with a thickness of about 1.5 $\mu$m is coated. More details on membrane coating are disclosed in e.g. U.S. Pat. No. 4,442,144 and U.S. Pat. No. 4,532,158.

The imaging element is preferably prepared by coating the photosensitive layer and other optional layers on the hydrophilic grained and anodized aluminum support. Alternatively said layers may be laminated to said support from a temporary support holding the layers in reverse order. Further details are disclosed in U.S. Pat. No. 5,273,858, which therefor is incorporated herein by reference.

To promote the image sharpness and, as a consequence thereof, the sharpness of the final printed copy, the anodization layer according to the invention may be coloured in the mass with an antihalation dye or pigment e.g. as described in JA-Pu-58-14,797 or the grained, anodized, and optionally sealed aluminum foil according to the invention can be provided with a very thin antihalation coating of a dye or pigment, which may be applied before or after said image receiving layer is applied. Also to promote the image sharpness the image receiving layer may incorporate at least one antihalation dye or pigment. The usual dyes and pigments can be chosen such that they prevent or reduce halation in the silver halide emulsions having any desired photosensitivity range comprised between 300 and 900 nm.

The photosensitive layer used in accordance with the present invention may be any silver halide emulsion layer being in water permeable relationship with said image receiving layer, comprising a hydrophilic colloid binder, at least one of the silver halide emulsions being photosensitive.

Layers being in waterpermeable contact with each other are layers that are contiguous to each other or only separated from each other by (a) waterpermeable layer(s). The nature of a waterpermeable layer is such that it does not substantially inhibit or restrain the diffusion of water or of compounds contained in an aqueous solution e.g. developing agents or complexed silver ions.

The photographic silver halide emulsion(s) for coating silver halide emulsion layers in accordance with the present invention can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

According to the present invention the silver halide emulsion or emulsions preferably consist principally of silver chloride while a fraction of silver bromide may be present ranging from 1 mole % to 40 mole %. The silver halide emulsions preferably belong to the core-/shell type well known to those skilled in the art in the sense that substantially all the bromide is concentrated in the core. This core contains preferably 10 to 40% of the total silver halide precipitated, while the shell consists preferably of 60 to 90% of the total silver halide precipitated. Most preferably a silver halide emulsion containing at least 70 mole % of silver chloride is used.

The average size of the silver halide grains may range from 0.10 to 0.70 μm, preferably from 0.25 to 0.45 μm.

Preferably during the precipitation stage iridium and-/or rhodium containing compounds or a mixture of both are added. The concentration of these added compounds ranges from $10^{-8}$ to $10^{-3}$ mole per mole of $AgNO_3$, preferably between $10^{-7}$ and $10^{-6}$ mole per mole of $AgNO_3$.

The silver halide emulsions can be chemically sensitized. A method of chemical sensitization has been described in the article of R. KOSLOWSKY, Z. Wiss. Photogr. Photophys. Photochem. 46, 65–72 (1951).

The silver halide emulsions of the DTR-element can be spectrally sensitized according to the spectral emission of the exposure source for which the DTR element is designed.

Suitable sensitizing dyes for the visible spectral region include methine dyes such as those described by F. M. Hamer in "The Cyanine Dyes and Related Compounds", 1964 John Wiley & Sons.

The spectral photosensitivity of the silver halide can also be adjusted for exposure by laser light e.g. helium-neon laser light, argon laser light, and solid state laser light. Dyes that can be used for adjusting the photosensitivity to laser light have been disclosed i.a. in the documents cited in EP-A-93200339.5 and U.S. Pat. No. 5,200,294.

The silver halide emulsions may contain the usual emulsion stabilizers. Suitable emulsion stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable emulsion stabilizers are i.a. heterocyclic mercapto compounds.

As binder in the silver halide emulsion layer(s) in connection with the present invention a hydrophilic colloid may be used, usually a protein, preferably gelatin. Gelatin can, however, be replaced in part or integrally by synthetic, semi-synthetic, or natural polymers.

The silver halide emulsions may contain pH controlling ingredients. Preferably the silver halide emulsion layer is coated at a pH Value below the isoelectric point of the gelatin to improve the stability characteristics of the coated layer. Other ingredients such as antifogging agents, development accelerators, wetting agents, and hardening agents for gelatin may be present. The silver halide emulsion layer may comprise light-screening dyes that absorb scattering light and thus promote the image sharpness. Suitable light-absorbing dyes are described in i.a. U.S. Pat. No. 4,092,168, U.S. Pat. No. 4,311,787, DE-P-2,453,217.

More details about the composition, preparation and coating of silver halide emulsions can be found in e.g. Product Licensing Index, Vol. 92, December 1971, publication 9232, p. 107–109.

The imaging element preferably also comprises an intermediate layer between the image receiving layer on the hydrophilic grained and anodized aluminum support and the photosensitive layer(packet) to facilate the removal of said layer(packet) thereby uncovering the silver image formed in the image receiving layer by processing the imaging element.

In one embodiment, the intermediate layer can be a water-swellable intermediate layer coated at a ratio of 0.01 to 2.0 g/m$^2$ and comprising at least one non-proteinic hydrophilic film-forming polymer and optionally comprising an antihalation dye or pigment as disclosed in EP-A-410500.

In another embodiment, the intermediate layer can be a layer comprising hydrophobic polymer beads having an average diameter not lower than 0.2 μm and having been prepared by polymerization of at least one ethylenically unsaturated monomer. Preferably, said intermediate layer in dry condition comprises said hydrophobic polymer beads in an amount of up to 80% of its total weight. Further details are disclosed in EP-A-483415.

A supplemental intermediate layer, which may be present between said silver halide emulsion containing layer and said water-swellable intermediate layer or said intermediate layer comprising hydrophobic polymer beads may incorporate one or more ingredients such as i.a. antihalation dyes or pigment, developing agents, silver halide solvents, base precursors, and anticorrosion substances.

When the imaging element is prepared by laminating a photosensitive layer or layer packet onto the image receiving layer the intermediate layer(s) are contained in the photosensitive layer packet, the water-swellable intermediate layer or the intermediate layer comprising hydrophobic polymer beads having an average diameter not lower than 0.2 μm and having been prepared by polymerization of at least one ethylenically unsaturated monomer being the upper layer.

A wide choice of cameras for exposing the photosensitive silver halide emulsion exists on the market. Horizontal, vertical and darkroom type cameras and contact-exposure apparatus are available to suit any particular class of reprographic work. The imaging element in accordance with the present invention can also be exposed with the aid of i.a. laser recorders and cathode rays tubes.

The development and diffusion transfer are effected with the aid of an aqueous alkaline solution in the presence of (a) developing agent(s) and (a) silver halide solvent(s). The developing agent(s) and/or the silver halide solvent(s) can be incorporated in the aqueous alkaline solution and/or in said silver halide emulsion layer and/or in any of said intermediate layers and/or in a supplemental hydrophilic colloid layer in water-permeable relationship with said silver halide emulsion layer. The latter supplemental hydrophilic colloid layer can be coated on top of said silver halide emulsion layer remotest from said hydrophilic grained and anodized aluminum support.

The silver halide solvent can also be incorporated at least in part in the physical development nuclei containing layer. When the aqueous alkaline solution does not comprise the developing agent(s), it is merely an activating liquid that is capable of dissolving the developing agent(s) contained in one of the layers.

Silver halide developing agents for use in accordance with the present invention are preferably of the p-dihydroxybenzene type, e.g. hydroquinone, methylhydroquinone or chlorohydroquinone, preferably in combination with an auxiliary developing agent being a 1-phenyl-3-pyrazolidinone-type developing agent and/or p-monomethylaminophenol. More details are disclosed in EP-A-93201649.6. However other developing agents can be used. Preferred amounts of the hydroquinone-type developing agents are in the range of 0.05 mole to 0.25 mole per liter and preferred amounts of secondary developing agent(s) in the range of $1.8 \times 10^{-3}$ to $2.0 \times 10^{-}$ mole per liter.

The silver halide solvent, which acts as a complexing agent for silver halide, preferably is a water-soluble thiosulphate or thiocyanate e.g. sodium, potassium, or ammonium thiosulphate and sodium, potassium, or ammonium thiocyanate.

Further Silver halide solvents that can be used in connection with the present invention are alkanolamines. Alkanolamines that are suitable for use in accordance with the present invention may be of the tertiary, secondary or primary type. Examples of alkanolamines that may be used in connection with the present invention are disclosed in e.g. EP-A 549830.

According to the present invention the alkanolamines are preferably present in the alkaline processing liquid in a concentration preferably between 0.05% and 10% by weight. However part or all of the alkanolamine can be present in one or more layers of the imaging element.

Further suitable silver halide solvents are thioethers. Preferably used thioethers are disclosed in e.g. U.S. Pat. No. 4,960,683 and U.S. Pat. No. 5,200,294.

Still further suitable silver halide Solvents are meso-ionic compounds. Preferred meso-ionic compounds for use in accordance with the present invention are triazolium thiolates and more preferably 1,2,4-triazolium-3-thiolates. More details are disclosed in EP-A 554585.

Still further suitable silver halide solvents are sulphite, amines, 2-mercaptobenzoic acid and those disclosed in "The Theory of the Photographic Process" 4th Ed., edited by T. H. James, pages 474–475. Further interesting silver halide solvents have been described in i.a. U.S. Pat. Nos. 2,857,276, 4,355,090, 4,297,429 and 4,297,430. Among these are cyclic imide compounds such as e.g. uracil and 5,5-dialkylhydantoins. Other suitable silver halide solvents are the alkyl sulfones.

Combinations of different silver halide solvents can be used and it is also possible to incorporate at least one silver halide solvent into a suitable layer of the imaging element and to add at least one other silver halide solvent to the developing solution.

Examples of suitable combinations of different silver halide solvents are a combination of (an) alkanolamine(s) and a thiosulfate as disclosed in EP-A 549831 and 4,6-dihydroxypyrimidines in combination with other silver halide solvents as disclosed in EP-A 549830.

The aqueous alkaline solution may further comprise sulphite e.g. sodium sulphite in an amount ranging from 40 g to 180 g per liter, preferably from 60 to 160 g per liter, and a silver halide solvent, preferably a water soluble thiosulphate and/or thiocyanate in an amount ranging from 5 g to 20 g per liter.

Combinations of at least one silver halide solvent and a regulator may also be used. Suitable regulators are disclosed in EP-A 547660 and in EP-A 576736.

The aqueous alkaline solution used according to the present invention preferably comprises aluminum ions in an amount of at least 0.3 g/l in order to prevent sticking of the emulsion layer to the transporting rollers when the emulsion is swollen with the aqueous alkaline solution. More preferably the aqueous alkaline solution used in accordance with the present invention comprises aluminum ions in an amount of at least 0.6 g/l.

The alkaline processing liquid preferably has a pH between 9 and 14 and more preferably between 10 and 13. Said pH may be established by an organic or inorganic alkaline substance or a combination thereof. Suitable inorganic alkaline substances are e.g. potassium or sodium hydroxide, carbonate, phosphate etc. Suitable organic alkaline substances are e.g. alkanolamines. In the latter case the alkanolamines will provide or help providing the pH and serve as a silver halide complexing agent.

The processing conditions such as pH, temperature and time may vary within broad ranges provided the mechanical strength of the materials to be processed is not adversely influenced and no decomposition takes place.

The aqueous alkaline solution may further comprise hydrophobizing agents for improving the hydrophobicity of the silver image obtained in the image image receiving layer. Generally these compounds contain a mercapto group or thiolate group and one or more hydrophobic substituents e.g. an alkyl containing at least 3 carbon atoms. Examples of hydrophobizing agents are e.g. those described in U.S. Pat. Nos. 3,776,728, and 4,563,410. Particularly preferred hydrophobizing agents are long chain (at least 5 carbon atoms) alkyl substituted mercaptotetrazoles. More details are disclosed in EP-A-93201649.6. The hydrophobizing agents can be used alone or in combination with each other.

The aqueous alkaline solution may comprise other ingredients such as e.g. oxidation preservatives, a compound releasing bromide ions, calcium-sequestering compounds, anti-sludge agents, and hardeners including latent hardeners.

Regeneration of the aqueous alkaline solution according to known methods is, of course, possible, whether the solution incorporates developing agent(s) and/or silver halide solvent(s) or not.

The development may be stopped—though this is often not necessary—with a so-called stabilization liquid, which actually is an acidic stop-bath having a pH preferably in the range of 5 to 6 as disclosed in EP-A-519,123.

The development and diffusion transfer can be initiated in different ways e.g. by rubbing with a roller, by wiping with an absorbent means e.g. with a plug of cotton or sponge, or by dipping the material to be treated in the liquid composition. Preferably, they proceed in an automatically operated apparatus. They are normally carried out at a temperature in the range of 18° C. to 30° C.

After formation of the silver image on the lithographic image receiving element an excess of alkaline solution still present on the monosheet layer assemblage may be eliminated, preferably by guiding the monosheet layer assemblage through a pair of squeezing rollers.

The silver image thus obtained in the image receiving layer is subsequently uncovered by treating the imaging element to remove the photosensitive layer and the intermediate layer.

Various embodiments for removing the photosensitive layer and the intermediate layer(s) are disclosed in EP-A 483,415.

According to a particularly preferred embodiment for removing the photosensitive layer(s) and the intermediate layer(s) the imaging element is held under a spray or jet of rinsing water or rinsing aqueous medium. The rinsing aqueous medium used to detach the intermediate layer(s) and the emulsion layer(s)(s) by rinsing may comprise ingredients such as i.a. weak acidifying agents, wetting agents, and hardeners including latent hardeners.

The temperature of the rinsing water may be varied widely but is preferably between 20° C. and 30° C.

The imaged surface of the lithographic aluminum support can be subjected to a chemical treatment that increases the hydrophilicity of the non-silver image parts and the oleophilicity of the silver image.

This chemical after-treatment is preferably carried out with a lithographic composition often called fixer, which comprises at least one compound enhancing the ink-receptivity and/or lacquer-receptivity of the silver image, and also comprises at least one compound that improves the ink-repelling characteristics of the hydrophilic grained and anodized aluminum support. More details on the composition of suitable fixers are given in U.S. Pat. No. 5,068,165, which therefor is incorporated herein by reference.

At the moment the treatment with the fixer is started the surface carrying the silver pattern may be in dry or wet state. In general, the treatment with the fixer does not take long, usually not longer than about 30 seconds and it may be carried out immediately after the processing and uncovering steps.

The fixer can be applied in different ways such as by rubbing with a roller, by wiping with an absorbent means e.g. with a plug of cotton or sponge, or by dipping the material to be treated in the fixer. The image-hydrophobizing step of the printing plate may also proceed automatically by conducting the printing plate through a device having a narrow channel filled with the fixer and conveying the printing plate at the end of the channel between two squeezing rollers removing the excess of liquid.

The following example illustrates the present invention without however, limiting it thereto. All parts, percentages and ratios are by weight unless otherwise indicated.

EXAMPLE 1

A 0,30 mm thick aluminum foil (AA 1050) was degreased by immersing the foil in an aqueous solution containing 10% phosphoric acid and subsequently etched in an aqueous solution containing 2 g/l of sodium hydroxide. The foil was then electrochemically grained using an alternating current in an aqueous solution containing 4 g/l of hydrochloric acid and 4 g/l of hydroboric acid at a temperature of 35° C. to form a surface topography with an average center-line roughness CLA of 0,7 $\mu$m. The aluminum plate was then desmutted with an aqueous solution containing 30% of sulfuric acid at 60° C. for 120 seconds. The foil was subsequently subjected to anodic oxidation in a 20% sulfuric acid aqueous solution at a temperature of 35° C., at a voltage of 20 V and at an anodic charge density of 320 C/dm$^2$ to form an anodic oxidation film with a barrier layer of 20 nm thickness and a total thickness of 2.4 g/m$^2$ of Al$_2$O$_3$. The foil was then washed with demineralised water and treated with an aqueous solution of NaHCO$_3$, rinsed with demineralised water and then dried. Four such aluminum supports were prepared.

Four coating solutions containing PdS nuclei were prepared as follows.

| Solution A (20° C.): | (NH$_4$)$_2$PdCl$_4$ | 1.74 g |
| --- | --- | --- |
| | polyvinyl alcohol (1% solution in water) | 20 ml |
| | water | 380 ml |
| Solution B (20° C.): | Na$_2$S.9H$_2$O | 1.61 g |
| | polyvinyl alcohol (1% solution in water) | 20 ml |
| | water | 380 ml |
| Solution C (20° C.): | Na$_2$S.9H$_2$O | 3.23 g |
| | polyvinyl alcohol (1% solution in water) | 40 ml |
| | water | 760 ml |

Solution A and B were simultaneously added to solution C at a rate of 100 ml/min. whilst stirring solution C at 400 rpm. To remove the excess sulphide and to obtain the desired concentration on PdS-nuclei the solution containing the PdS-nuclei was pumped through a dialyser. About only 2% of the nuclei have a diameter more than 4.5 nm while the average diameter is 1.8 nm.

The concentration on PdS-nuclei in the 4 solutions is as follows:

| Solution M | 0.233 g PdS/l |
| --- | --- |
| Solution N | 0.467 g PdS/l |
| Solution O | 0.733 g PdS/l |
| Solution P | 0.933 g PdS/l |

An image receiving element I was obtained by coating an aluminum support with a silver-receptive stratum with a wet thickness of 1.5 $\mu$m from the solution M. The image receiving elements II, III, IV were obtained in an analogous way from the solutions N, O, and P. The concentration on PdS-nuclei is given in Table 1.

An intermediate layer was then provided on the dry silver-receptive stratum from an aqueous composition in such a way that the resulting dried layer had a weight of 0.5 g of polymethyl methacrylate beads per m$^2$, said composition comprising:

| a 20% dispersion of polymethyl methacrylate beads in a mixture of equal volumes of water and ethanol having an average diameter of 1.0 $\mu$m | 50 ml |
| --- | --- |
| Helioechtpapierrot BL (trade mark for a dye sold by BAYER AG, D-5090 Leverkusen, West-Germany) | 2.5 g |

-continued

| | |
|---|---|
| saponine | 2.5 g |
| sodium oleylmethyltauride | 1.25 g |
| demineralized water | 300 ml |
| (pH-value: 5.6) | |

Finally a substantially unhardened photosensitive negative-working cadmium-free gelatin silver chlorobromoiodide emulsion layer (97.98/2/0.02 mol %) was provided to the obtained elements I to IV, the silver halide being provided in an amount corresponding to 2.40 g of silver nitrate per m² and the gelatin content of the emulsion layer being 1.58 g/m².

The 4 imaging elements were identically exposed through a contact screen in a process-camera and immersed for 8 s at 24° C. in a freshly made developing solution having the following ingredients:

| | |
|---|---|
| carboxymethylcellulose | 4 g |
| sodium hydroxide | 22.5 g |
| anhydrous sodium sulphite | 120 g |
| hydroquinone | 20 g |
| 1-phenyl-3-pyrazolidinone | 6 g |
| potassium bromide | 0.75 g |
| anhydrous sodium thiosulphate | 8 g |
| ethylene diamine tetraacetic acid tetrasodium salt | 2 g |
| demineralized water to make | 1000 ml |
| pH (24° C.) = 13 | |

The initiated diffusion transfer was allowed to continue for 30 s to form a silver image in the image receiving layers.

To remove the developed silver halide emulsion layer and the intermediate layer from the aluminum foils the developed monosheet DTR materials were rinsed for 30 s with a water jet at 30° C.

Next, the imaged surface of the aluminum foil was rubbed with a fixer to enhance the water-receptivity of the non-image areas and to make the image areas oleophilic ink-receptive. The fixer had the following composition:

| | |
|---|---|
| 10% aqueous n-hexadecyl trimethyl ammonium chloride | 25 ml |
| 20% aqueous solution of polystyrene sulphonic acid | 100 ml |
| potassium nitrate | 12.5 g |
| citric acid | 20.0 g |
| 1-phenyl-5-mercaptotetrazole | 2.0 g |
| sodium hydroxide | 5.5 g |
| water to make | 1000 ml |
| pH (20° C.) = 4 | |

The amount of silver deposited (silver yield) in the image receiving layer was then measured using an analytical X-ray Fluorescence Spectrophotometer PHILIPS 1400 (tradename of Philips-The Netherlands). The results obtained for each of the 4 material are given in Table 1.

The printing plates thus prepared were mounted on the same offset printing machine (Heidelberg GTO-46) and were printed under identical conditions. A commercial dampening solution AQUA TAME was used at a 5% concentration for fountain solution, and K+E 125 as ink. A compressible rubber blanket was used. The number of good copies obtained with each of the printing plates I to IV is given in Table 1.

TABLE 1

| Sample | PdS (mg/m²) | Ag yield (g/m²) | No. of good copies |
|---|---|---|---|
| I | 0.35 | 1.03 | 1000 |
| II | 0.7 | 1.35 | 5000 |
| III | 1.1 | 1.38 | 30,000 |
| IV | 1.4 | 1.44 | 50,000 |

Evaluation:

From the above it can be seen that when a DTR imaging element is used comprising a hydrophilic grained and anodized aluminum support with an aluminum oxide barrier layer of a sufficient thickness and an image receiving layer containing physical development nuclei in an amount of at least 0.7 mg/m², printing plates with a high printing endurance and of good printing quality are obtained. It is further observed that by increasing the amount of physical development nuclei, the printing endurance is still markedly improved while the silver yield hardly changes.

We claim:

1. An imaging element comprising in the order given (i) a hydrophilic grained and anodized aluminum support, the anodic aluminum oxide film comprising a porous thick outer layer and a thin, dense inner barrier layer, (ii) an image receiving layer containing physical development nuclei and (iii) a photosensitive layer containing a silver halide emulsion being in water permeable relationship with said image receiving layer, characterized in that said aluminum support comprises an aluminum oxide barrier layer of at least 10 nm thickness and said physical development nuclei are contained in an amount of at least 0.4 mg/m².

2. An imaging element according to claim 1 wherein the thickness of said aluminum oxide barrier layer is between 15 and 50 nm.

3. An imaging element according to claim 1, wherein said aluminum support has a CLA value between 0.2 and 1.5 μm.

4. An imaging element according to claim 1, wherein the thickness of said anodic aluminum oxide film is comprised between 0.4 and 4.0 μm.

5. An imaging element according to claim 1, wherein the resistance against corrosion of the grained and anodized side of the aluminum support by an aqueous 0.1M sodium hydroxide solution at 22° C. of said grained and anodized aluminum support is at least 30 seconds.

6. An imaging element according to claim 1, wherein said image receiving layer contains physical development nuclei in an amount comprised between 1.1 mg/m² and 20 mg/m².

7. An imaging element according claim 1, wherein said image receiving layer contains as physical development nuclei sulphides of heavy metals having an average diameter less than 6 nm and wherein the number of nuclei having a diameter larger than 4.5 nm is less than 15% of the total number of nuclei contained in said image receiving layer.

8. An imaging element according claim 1 comprising an intermediate layer between said image receiving layer and said photosensitive layer, said intermediate layer comprising a non-proteinic hydrophilic film-forming polymer or hydrophobic polymer beads having an average diameter not lower than 0.2 μm and having been prepared by polymerization of a ethylenically unsaturated monomer.

9. A method for making an offset printing plate according to the silver salt diffusion transfer process comprising the steps of:
   (a) image-wise exposing an imaging element comprising in the order given (i) a hydrophilic grained and anodized aluminum support, (ii) an image receiving layer containing physical development nuclei and (iii) a photosensitive layer containing a silver halide emulsion being in water permeable relationship with said image receiving layer,
   (b) applying an aqueous alkaline solution to the imaging element in the presence of (a) developing agent(s) and (a) silver halide solvent(s) to form a silver image in said photosensitive layer and to allow unreduced silver halide or complexes formed thereof to diffuse image-wise from the photosensitive layer to said image receiving layer to produce therein a silver image,
   (c) treating the imaging element to remove the layer(s) on top of said image receiving layer, thereby uncovering said silver image formed in said image receiving layer, characterized in that said aluminum support comprises an aluminum oxide barrier layer of at least 10 nm thickness and said physical development nuclei are contained in an amount of at least 0.7 mg/m$^2$.

10. A method according to claim 9 wherein said imaged surface obtained after removing the photosensitive layer and the intermediate layer, is treated with a fixer to enhance the water-receptivity of the non-image areas and to enhance the ink-receptivity of the image areas.

* * * * *